United States Patent [19]

Pfiester et al.

[11] Patent Number: 5,422,300

[45] Date of Patent: * Jun. 6, 1995

[54] METHOD FOR FORMING ELECTRICAL ISOLATION IN AN INTEGRATED CIRCUIT

[75] Inventors: James R. Pfiester; Prashant Kenkare; Kent J. Cooper; Bich-Yen Nguyen, all of Austin, Tex.

[73] Assignee: Motorola Inc., Schaumburg, Ill.

[*] Notice: The portion of the term of this patent subsequent to Aug. 17, 2010 has been disclaimed.

[21] Appl. No.: 291,781

[22] Filed: Aug. 17, 1994

Related U.S. Application Data

[60] Continuation of Ser. No. 91,100, Jul. 13, 1993, abandoned, which is a division of Ser. No. 984,792, Dec. 3, 1992, Pat. No. 5,236,862.

[51] Int. Cl.$^6$ .............................................. H01L 21/76
[52] U.S. Cl. ................................... 437/70; 437/69; 437/72; 437/73
[58] Field of Search .................... 437/69, 70, 72, 73

[56] References Cited

U.S. PATENT DOCUMENTS

| 4,016,594 | 4/1977 | Shappir | 357/41 |
|---|---|---|---|
| 4,708,768 | 11/1987 | Enomoto et al. | 156/657 |
| 4,746,963 | 5/1988 | Uchida et al. | 437/67 |
| 4,755,477 | 7/1988 | Chao | 437/64 |
| 4,851,370 | 7/1989 | Doklan et al. | 437/225 |
| 4,897,364 | 1/1990 | Nguyen et al. | 437/69 |
| 4,923,563 | 5/1990 | Lee et al. | 156/649 |
| 4,927,780 | 5/1990 | Roth et al. | 437/69 |
| 5,093,277 | 3/1992 | Arima et al. | 437/69 |
| 5,134,089 | 7/1992 | Barden et al. | 437/70 |
| 5,137,843 | 8/1992 | Kim et al. | 437/70 |
| 5,175,123 | 12/1992 | Vasquez et al. | 437/69 |
| 5,236,862 | 8/1993 | Pfiester et al. | 437/70 |

FOREIGN PATENT DOCUMENTS

| 0424018 | 4/1991 | European Pat. Off. | 437/69 |
|---|---|---|---|
| 0076865 | 5/1982 | Japan | 437/69 |
| 0296741 | 12/1986 | Japan | 437/69 |

OTHER PUBLICATIONS

Manabu Itsumi et al., "Identification and Elimination of Gate Oxide Defect Origin Produced During Selective Field Oxidation," Journal of the Electrochemical Society, vol. 129, No. 4, Apr. 1982, pp. 800–806.

N. Hayasaka et al., "Highly Selective Etching of Si3N4 over SiO2 Employing a Downstream Type Reactor," Solid State Technology, Apr. 1988, pp. 127–130.

M. Ghezzo et al., "Laterally Sealed LOCOS Isolation," Journal of the Electrochemical Society, vol. 134, No. 6, Jun. 1987, pp. 1475–1479.

Silicon Processing For the VLSI Era, vol. 2, by S. Wolf, Lattice Press, 1990, pp. 20–27.

J. M. Sung et al., "Reverse L-Shape Sealed Poly-Buffer LOCOS Technology," IEEE Transactions on Electron Devices, vol. 11, No. 11, Nov. 1990, pp. 549–551.

Hui et al., "Sealed-Interface Local Oxidation Technology," IEEE Transactions on Electron Devices, vol. 29, No. 4, Apr. 1982, pp. 554–561.

Primary Examiner—Brian E. Hearn
Assistant Examiner—Trung Dang
Attorney, Agent, or Firm—Kent J. Cooper

[57] ABSTRACT

Defect-free field oxide isolation is achieved using a laminated layer (14) of thermal silicon dioxide and chemically vapor deposited silicon dioxide underneath a silicon nitride field oxidation mask (18). The laminated layer (14) of silicon dioxide is formed on a silicon substrate (12) and a layer of silicon nitride is then deposited over it. The silicon nitride is subsequently patterned to form a field oxidation mask (18) which defines isolation regions (22) within the silicon substrate (12). Field oxide (34) is grown in the isolation regions (22) of the silicon substrate (12) and the field oxidation mask (18) is subsequently removed.

16 Claims, 2 Drawing Sheets

METHOD FOR FORMING ELECTRICAL ISOLATION IN AN INTEGRATED CIRCUIT

CROSS-REFERENCE TO RELATED APPLICATION

This application is a continuation of prior application Ser. No. 08/091,100, filed Jul. 13, 1993, now abandoned, which is a divisional of application Ser. No. 07/984,792, filed on Dec. 3, 1992, now U.S. Pat. No. 5,236,862, issued on Aug. 17, 1993.

FIELD OF THE INVENTION

This invention relates generally to semiconductor devices, and more specifically to a process for the formation of electrical isolation structures in a semiconductor integrated circuit.

BACKGROUND OF THE INVENTION

Local oxidation of silicon (LOCOS) is the most commonly used isolation technology for silicon integrated circuits. Unfortunately, LOCOS has an inherently large field oxide encroachment that precludes it from being used in advanced integrated circuits requiring high device packing densities. In a standard LOCOS process a thin layer of pad oxide is thermally grown on the surface of a silicon wafer. A silicon nitride layer is then deposited onto the pad oxide layer. The silicon nitride layer is then photolithographically patterned and etched to define active regions and isolation regions. Field oxide is then grown in the isolation regions while the active regions, which are masked by the patterned silicon nitride layer, are protected from the oxidation process. After field oxide growth, however, the area of the resulting active region is smaller than the actual intended area, as defined by the patterned silicon nitride layer. This occurs because oxygen laterally diffuses through the pad oxide layer, underneath the patterned silicon nitride mask, and reacts with the underlying silicon surface. Therefore, field oxide is formed not only in the isolation regions, but it also encroaches into the adjacent active regions. As a result, scaling of active area dimensions is limited and therefore integrated circuits with high device packing densities cannot be achieved with standard LOCOS isolation.

In order to reduce field oxide encroachment, several LOCOS-like isolation techniques have been proposed. In one approach the pad oxide layer lying underneath the silicon nitride oxidation mask is undercut to form a cavity. The cavity is then filled using a conformal layer of polysilicon. During field oxidation, the polysilicon filled cavity acts as a diffusion barrier and thus inhibits the transportation of oxygen to the silicon surface underlying the edge of the silicon nitride oxidation mask. Unfortunately, the polysilicon filled cavity is not a perfect diffusion barrier. Therefore, oxidation of the silicon surface underlying the edge portion of the oxidation mask still occurs, and as a result, active regions are still encroached upon by the field oxide.

In a second approach, the cavity is filled with a conformal layer of silicon nitride, which is then anisotropically etched to form a sidewall spacer adjacent to the silicon nitride filled cavity. During field oxide formation, the silicon nitride filled cavity and the silicon nitride sidewall spacer both act as diffusion barriers and thus inhibit the transportation of oxygen to the silicon surface, which is underlying the edge portion of the oxidation mask. Unfortunately, with this approach, it is difficult to uniformly control field oxide encroachment. The sidewall spacer formation process requires that silicon nitride be selectively etched with respect to the underlying oxidation mask. Silicon nitride, however, is predominately used as the oxidation mask in these isolation schemes. Therefore, as a result of variations in the silicon nitride etch rate and in spacer film thickness, the silicon nitride oxidation mask is non-uniformly etched and has a thickness that varies across the wafer and from wafer to wafer. Since field oxide encroachment is highly dependent on oxidation mask thickness, the resulting encroachment into active regions also varies across the wafer, and from wafer to wafer. Additionally, the sidewall spacer formation process also reduces the geometry of the isolation regions. Therefore, field oxide thinning, which is known to occur in isolation regions which have a small geometry, is further exacerbated by the presence of the silicon nitride sidewall spacers. Therefore, with this isolation technique, device scaling is further limited by field oxide thinning. Accordingly, a need exists for an isolation process that effectively and reproducibly reduces field oxide encroachment and minimizes field oxide thinning.

SUMMARY OF THE INVENTION

The previously mentioned problems with existing isolation processes are overcome by the present invention. In one embodiment of the invention, an integrated circuit device is formed by providing a semiconductor substrate. A first buffer layer is formed overlying the substrate. A masking layer is formed overlying the first buffer layer. The masking layer is patterned to form an exposed portion of the buffer layer and to define an isolation region of the substrate. The patterning process also leaves a remaining portion of the masking layer overlying the substrate. The exposed portion of the buffer layer is etched to form a recess under an edge portion of the remaining portion of the masking layer. The etch process also forms an exposed portion of the substrate and leaves a remaining portion of the buffer layer overlying the substrate. A second buffer layer is formed overlying the exposed portion of the substrate. A nitride layer is formed overlying the remaining portion of the masking layer and the second buffer layer. The nitride layer also substantially fills the recess. The nitride layer is oxidized to form an oxidized layer and to form electrical isolation in the isolation region of the substrate.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 1:
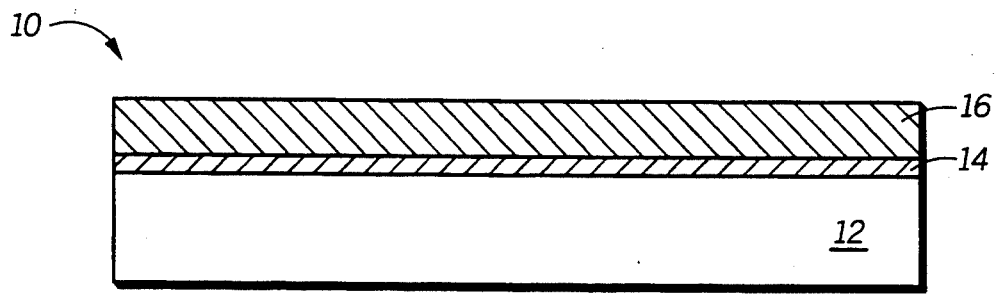
FIGS. 1–7 illustrate, in cross-section, process steps in accordance with one embodiment of the invention, wherein like reference numerals designate identical or corresponding parts throughout the several views.

FIGS. 1 through 7 illustrate, in cross-section, process steps in accordance with one embodiment of the invention wherein electrical isolation structures are formed in an integrated circuit. Shown in FIG. 1 is a portion 10 of an integrated circuit structure comprising a semiconductor substrate 12, a first buffer layer 14, and a masking layer 16. Substrate 12 is preferably monocrystalline silicon. Alternatively substrate 12 may be silicon on insulator, or silicon on sapphire, et cetera. Substrate 12 is preferably thermally oxidized to form first buffer layer 14, which may have a thickness ranging from 5 to 100 nanometers. Alternatively, first buffer layer 14 may be chemical vapor deposited silicon dioxide or a laminate of thermally grown and chemically vapor deposited silicon dioxide. Following the formation of first buffer layer 14, masking layer 16 is formed overlying first buffer layer 14. Masking layer 16 is preferably chemical vapor deposited silicon nitride and may have a thickness ranging from 50 to 300 nanometers. Alternatively, masking layer 16 may also be a laminate of silicon nitride overlying polysilicon, or another material such as oxynitride.

Figure 2:
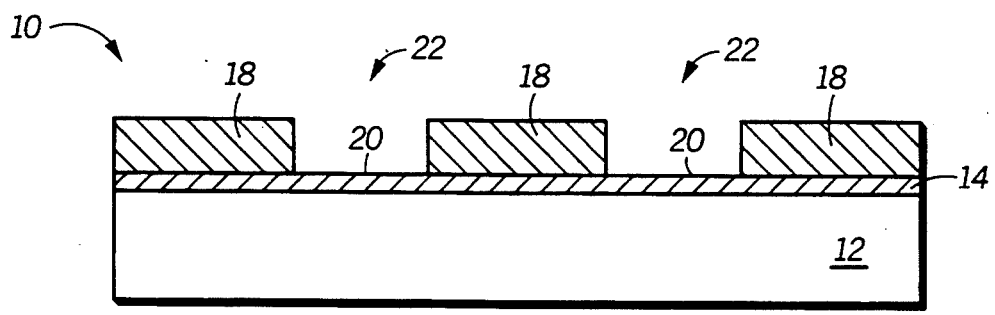

In FIG. 2, using conventional photolithographic patterning and etching techniques, masking layer 16 is then patterned to leave a remaining portion 18, of masking layer 16, overlying substrate 12. The patterning process also exposes a portion 20 of buffer layer 14 and defines an isolation region 22 of substrate 12. Additionally, after the patterning process, isolation region 22 may be doped using a diffusion or implantation step.

Figure 3:
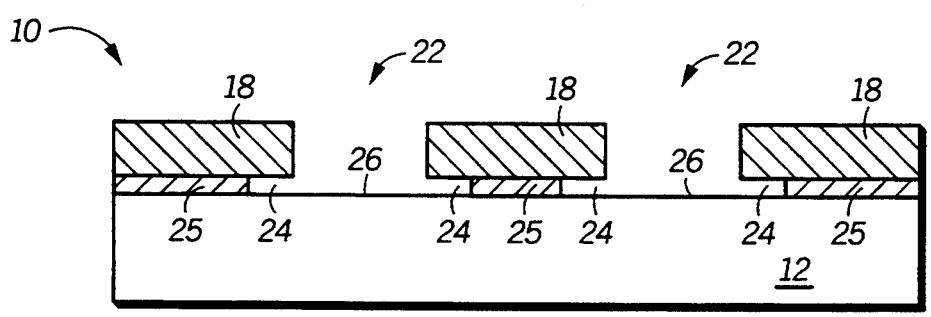

In FIG. 3, exposed portion 20 of buffer layer 14 is then selectively and isotropically etched to form a recess 24 under an edge portion of remaining portion 18. The etching process also leaves a remaining portion 25 of buffer layer 14 overlying substrate 12, and in addition forms an exposed portion 26 of substrate 12. A wet etchant such as hydrofluoric acid is preferably used to etch exposed portion 20, and thus form recess 24. Alternatively, exposed portion 20 may also be etched using other conventional isotropic etching techniques such as vapor etching or chemical downstream plasma etching.

Figure 4:
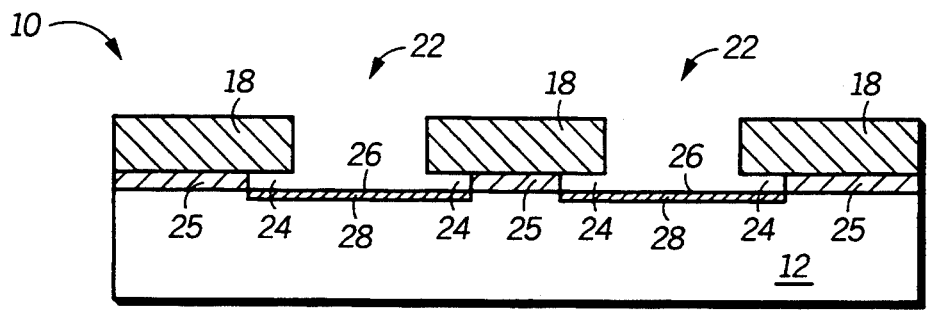

The process continues in FIG. 4 with the formation of a second buffer layer 28 overlying exposed portion 26 of substrate 12. Buffer layer 28 is preferably a silicon dioxide layer having a thickness of less than 25 nanometers, which is formed by thermally reoxidizing exposed portion 26. Alternatively, buffer layer 28 may be a silicon nitride or silicon oxynitride layer, which is formed by nitriding exposed portion 26. For example, the silicon nitride or silicon oxynitride layers may be formed by rapid thermally annealing exposed portion 26 in a nitrogen containing ambient such as ammonia or nitrous oxide. Alternatively, they may also be formed by furnace annealing exposed portion 26 in a nitrogen containing ambient such as ammonia or nitrous oxide.

Figure 5:
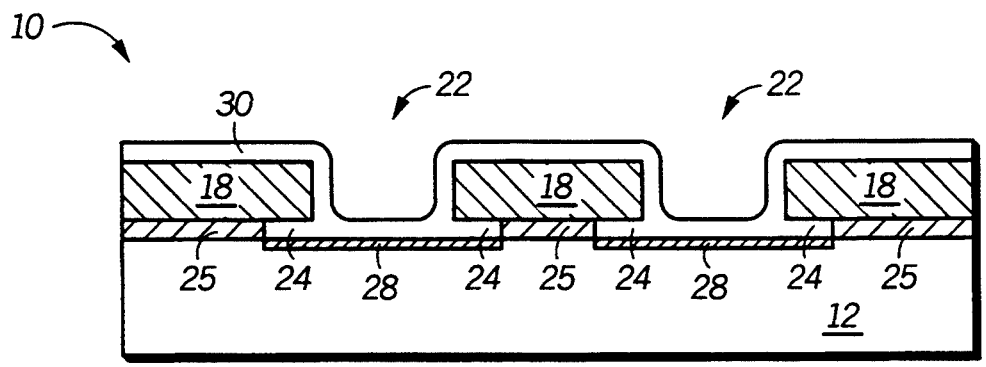

In FIG. 5, a nitride layer 30 is then formed overlying remaining portion 18 and second buffer layer 28. As shown in FIG. 5, nitride layer 30 substantially fills recess 24. Nitride layer 30 is preferably a chemically vapor deposited silicon nitride layer with a thickness of less than 30 nanometers. Alternatively, nitride layer 30 may be a thin chemically vapor deposited oxynitride layer or a thin silicon dioxide layer that has been nitrided to form a nitride or oxynitride layer. For example, a thin layer of silicon dioxide may be deposited by chemical vapor deposition and then rapid thermally annealed in ammonia or nitrous oxide to form nitride layer 30. Additionally, nitride layer 30 may be plasma deposited silicon nitride or oxynitride.

Figure 6:
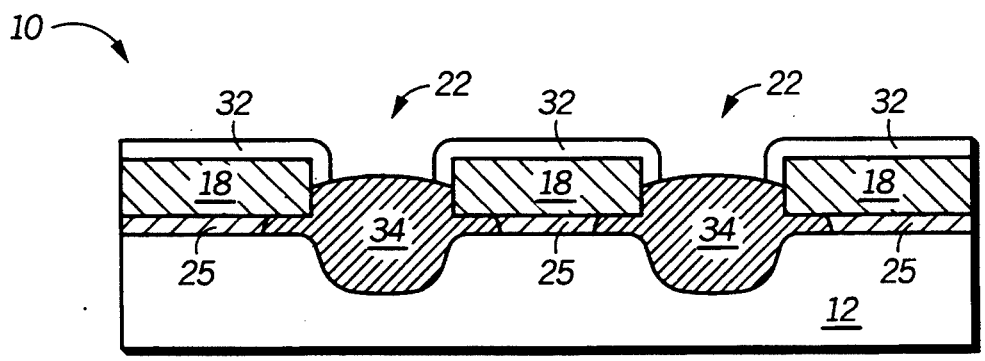

After nitride layer 30 has been formed, a thermal oxidation is performed to grow a thick electrical isolation oxide 34 within isolation region 22 of substrate 12, as shown in FIG. 6. During the oxidation process, nitride layer 30 is completely oxidized to form an oxidized layer 32. The oxidation process is preferably carried out in a furnace at about 900 to 1200 degrees Celsius in the presence of nitrogen and steam.

Figure 7:
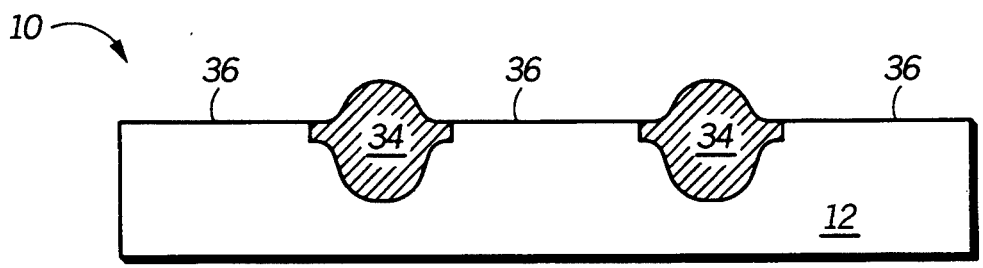

Portions of oxidized layer 32, that overlie remaining portion 18, are then removed with hydrofluoric acid. Alternatively, other conventional dry or wet etching techniques may also be used to remove portions of oxidized layer 32. Remaining portion 18 and remaining portion 25 are then removed, as shown in FIG. 7. In a preferred embodiment remaining portion 18 is removed with phosphoric acid and remaining portion 25 is removed with hydrofluoric acid. Alternatively, other conventional dry or wet etching techniques may be used to remove remaining portion 18 or remaining portion 25. Semiconductor devices can then be formed in active regions 36 separated by isolation oxide 34.

The foregoing description and illustrations contained herein demonstrate many of the advantages associated with the present invention. One advantage is that silicon nitride, which is a good oxidation barrier, is used to fill the cavity, as opposed to polysilicon. Therefore, oxidation of the silicon surface, underlying the edge portion of the oxidation mask, is further minimized and as a result, field oxide encroachment into the active regions is reduced. In addition, the patterned silicon nitride oxidation mask is densified during the oxidation of nitride layer 30. Therefore, a separate densification step for the silicon nitride oxidation mask is not required with this process. Furthermore, although it is not obvious, an electrically reliable field oxide can be grown by oxidizing through a silicon nitride layer, which is overlying the isolation region of a substrate. Unexpectedly, oxidation of the silicon nitride layer occurs in a uniform manner and results in the formation of a pin-hole free field oxide. Therefore, the silicon nitride film does not need to be etched prior to field oxide formation, and as a result field oxide encroachment into active regions can be uniformly controlled across a wafer and from wafer to wafer.

Thus it is apparent that there has been provided, in accordance with the invention, a method for forming oxide isolation that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, substrate 12 could be trenched prior to the formation of buffer layer 28. Furthermore, although it is not shown in FIG. 2, buffer layer 20 may also be etched during the patterning process. In addition, it should be known that silicon-rich oxynitride and silicon-rich silicon nitride could also be used for nitride layer 30. Altering the silicon concentration in these films is known to change their physical properties, such as film stress, and these physical properties could be optimized for the present invention. Therefore, it is intended that this invention encompass all such variations and modifications as fall within the scope of the appended claims.

What is claimed is:

1. A method for forming an electrical isolation structure in an integrated circuit comprising the steps of:

providing a semiconductor substrate, the semiconductor substrate having a major surface;

forming a laminate of thermally grown and deposited silicon dioxide overlying the major surface of the semiconductor substrate;

forming an oxidation masking layer overlying the laminate;

patterning the oxidation masking layer to form a remaining portion of the oxidation masking layer, and to define an active region of the semiconductor substrate and to define an isolation region of the semiconductor substrate, wherein the remaining portion of the oxidation masking layer overlies the active region of the semiconductor substrate;

forming the electrical isolation structure in the isolation region of the semiconductor substrate such that a remaining portion of the laminate is left underlying the remaining portion of the oxidation masking layer, wherein as a result of forming the electrical isolation structure a layer of oxidized silicon nitride is formed overlying the remaining portion of the oxidation masking layer;

removing the layer of oxidized silicon nitride with hydrofluoric acid to expose the remaining portion of the oxidation masking layer;

removing the remaining portion of the oxidation masking layer with a dry etch; and removing the remaining portion of the laminate with hydrofluoric acid to expose the major surface of the semiconductor substrate in the active region.

2. The method of claim 1, wherein the step of forming the oxidation masking layer comprises:
depositing a silicon nitride layer.

3. The method of claim 1 further comprising the steps of:
forming a recess under an edge portion of the remaining portion of the oxidation masking layer; and
forming a silicon nitride layer overlying the remaining portion of the oxidation masking layer and the isolation region, wherein the silicon nitride layer substantially fills the recess.

4. The method of claim 1 further comprising the step of:
doping the isolation region prior to forming the electrical isolation structure.

5. The method of claim 1, wherein the step of forming the electrical isolation structure comprises:
oxidizing a portion of the semiconductor substrate underlying the isolation region.

6. The method of claim 1, wherein the step of forming the laminate comprises:
oxidizing the major surface of the semiconductor substrate to form a layer of thermal silicon dioxide; and
chemically vapor depositing a layer of deposited silicon dioxide overlying the layer of thermal silicon dioxide.

7. A method for forming an electrical isolation structure in an integrated circuit comprising the steps of:
providing a semiconductor substrate, the semiconductor substrate having a major surface;
forming a laminate of thermally grown and deposited silicon dioxide overlying the major surface of the semiconductor substrate;
forming a polysilicon layer overlying the laminate;
forming an oxidation masking layer overlying the polysilicon layer;

patterning the oxidation masking layer to form a remaining portion of the oxidation masking layer, and to define an active region of the semiconductor substrate and to define an isolation region of the semiconductor substrate, wherein the remaining portion of the oxidation masking layer overlies the active region of the semiconductor substrate;

forming the electrical isolation structure in the isolation region of the semiconductor substrate to leave a remaining portion of the polysilicon layer and a remaining portion of the laminate underlying the remaining portion of the oxidation masking layer, wherein as a result of forming the electrical isolation structure a layer of oxidized silicon nitride is formed overlying the remaining portion of the oxidation masking layer;

removing the layer of oxidized silicon nitride with hydrofluoric acid to expose the remaining portion of the oxidation masking layer;

removing the remaining portion of the oxidation masking layer and the remaining portion of the polysilicon layer with a dry etch to expose the remaining portion of the laminate; and removing the remaining portion of the laminate with hydrofluoric acid to expose the major surface of the semiconductor substrate in the active region.

8. The method of claim 7, wherein the step of forming the oxidation masking layer comprises:
depositing a silicon nitride layer.

9. The method of claim 7, wherein the step of forming the electrical isolation structure comprises:
oxidizing a portion of the semiconductor substrate underlying the isolation region.

10. The method of claim 7, wherein the step of forming the laminate comprises:
oxidizing the major surface of the semiconductor substrate to form a layer of thermal silicon dioxide; and
chemically vapor depositing a layer of deposited silicon dioxide overlying the layer of thermal silicon dioxide.

11. The method of claim 7 further comprising the steps of:
etching the laminate to form a recess; and
forming a silicon nitride layer overlying the remaining portion of the oxidation masking layer and the isolation region, wherein the silicon nitride layer substantially fills the recess.

12. A method for forming an electrical isolation structure in an integrated circuit comprising the steps of:
providing a semiconductor substrate, the semiconductor substrate having a major surface;
forming a laminate of thermally grown and deposited silicon dioxide overlying the major surface of the semiconductor substrate;
forming a polysilicon layer overlying the laminate;
forming an oxidation masking layer overlying the polysilicon layer;
patterning the oxidation masking layer to form a remaining portion of the oxidation masking layer, and to define an active region of the semiconductor substrate and to define an isolation region of the semiconductor substrate, wherein the remaining portion of the oxidation masking layer overlies the active region of the semiconductor substrate;
forming the electrical isolation structure in the isolation region of the semiconductor substrate to leave a remaining portion of the polysilicon layer and a remaining portion of the laminate underlying the remaining portion of the oxidation masking layer, wherein as a result of forming the electrical isolation structure a layer of oxidized silicon nitride is formed overlying the remaining portion of the oxidation masking layer;

removing the layer of oxidized silicon nitride with hydrofluoric acid to expose the remaining portion of the oxidation masking layer;

removing the remaining portion of the oxidation masking layer with phosphoric acid;

removing the remaining portion of the polysilicon layer; and removing the remaining portion of the laminate with hydrofluoric acid to expose the major surface of the semiconductor substrate in the active region.

13. The method of claim 12, wherein the step of forming the oxidation masking layer comprises:

depositing a silicon nitride layer.

14. The method of claim 12, wherein the step of forming the electrical isolation structure comprises:

oxidizing a portion of the semiconductor substrate underlying the isolation region.

15. The method of claim 12, wherein the step of forming the laminate comprises:

oxidizing the major surface of the semiconductor substrate to form a layer of thermal silicon dioxide; and chemically vapor depositing a layer of deposited silicon dioxide overlying the layer of thermal silicon dioxide.

16. The method of claim 12 further comprising the steps of:

etching the laminate to form a recess; and forming a silicon nitride layer overlying the remaining portion of the oxidation masking layer and the isolation region, wherein the silicon nitride layer substantially fills the recess.

* * * * *